(12) United States Patent
Yu

(10) Patent No.: US 10,192,634 B2
(45) Date of Patent: Jan. 29, 2019

(54) WIRE ORDER TESTING METHOD AND ASSOCIATED APPARATUS

(71) Applicant: MediaTek Singapore Pte. Ltd., Singapore (SG)

(72) Inventor: Chun-Xue Yu, Shenzhen (CN)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/795,548

(22) Filed: Oct. 27, 2017

(65) Prior Publication Data

US 2018/0144812 A1    May 24, 2018

(30) Foreign Application Priority Data

Nov. 24, 2016    (CN) .......................... 2016 1 1062297

(51) Int. Cl.

| | | |
|---|---|---|
| *G11C 29/00* | (2006.01) | |
| *G11C 29/38* | (2006.01) | |
| *G01R 31/319* | (2006.01) | |
| *G11C 29/02* | (2006.01) | |
| *G11C 29/10* | (2006.01) | |

(Continued)

(52) U.S. Cl.

CPC ........ *G11C 29/38* (2013.01); *G01R 31/31912* (2013.01); *G11C 29/022* (2013.01); *G11C 29/10* (2013.01); *G11C 29/1201* (2013.01); *G11C 29/12015* (2013.01); *G11C 29/36* (2013.01); *G11C 29/56004* (2013.01); *G11C 29/56012* (2013.01); *G11C 2029/3602* (2013.01); *G11C 2029/5602* (2013.01)

(58) Field of Classification Search

CPC ....... G11C 29/38; G11C 29/022; G11C 29/10; G11C 29/1201; G11C 29/12015; G11C 29/36; G11C 29/56004; G11C 29/56012; G11C 2029/3602; G11C 2029/5602; G01R 31/31912

USPC ....... 714/718, 719, 723, 724, 725, 733, 734, 714/735; 324/527, 528, 756.04, 757, 324/758.01, 759, 761, 763, 765

See application file for complete search history.

(56) References Cited

U.S. PATENT DOCUMENTS

| | | | |
|---|---|---|---|
| 5,889,786 A | 3/1999 | Shimogama | |
| 6,252,805 B1 * | 6/2001 | So .......................... | G11C 29/38 365/189.07 |

(Continued)

FOREIGN PATENT DOCUMENTS

| | | |
|---|---|---|
| CN | 103941134 A | 7/2014 |
| JP | 2008-180616 A | 8/2008 |

(Continued)

*Primary Examiner* — Christine T. Tu

(74) *Attorney, Agent, or Firm* — McClure, Qualey & Rodack, LLP

(57) ABSTRACT

A wire order testing method for testing pin connection relationships between a memory device and an electronic device is provided. The method includes the steps of: testing the memory device with at least one test pattern to obtain at least one first data; predicting at least one second data that is to be obtained from the testing of the memory device with the test pattern according to the mapping relationships between the test pattern and the pins of the memory device; determining the pin connection relationships between the memory device and the electronic device according to the first data and second data.

20 Claims, 11 Drawing Sheets

(51) Int. Cl.
    *G11C 29/12*    (2006.01)
    *G11C 29/36*    (2006.01)
    *G11C 29/56*    (2006.01)

(56) References Cited

U.S. PATENT DOCUMENTS

2004/0044938 A1* 3/2004 Heo ................. G01R 31/31926
                                                        714/738
2008/0178054 A1* 7/2008 Lee ........................ G11C 29/40
                                                        714/719

FOREIGN PATENT DOCUMENTS

| TW | 200914858 A | 4/2009 |
| TW | M523102 U | 6/2016 |
| TW | 201629515 A | 8/2016 |

* cited by examiner

WIRE ORDER TESTING METHOD AND ASSOCIATED APPARATUS

CROSS REFERENCE TO RELATED APPLICATIONS

This Application claims priority of China Patent Application No. 201611062297.X, filed on Nov. 24, 2016, the entirety of which is incorporated by reference herein.

BACKGROUND OF THE INVENTION

Field of the Invention

The present invention relates to storage technologies, and in particular to a wire order testing method, apparatus, and electronic device.

Description of the Related Art

Memory devices are components used for storing data, and are widely used in storing the data of electronic devices. Each pin on a memory device may connect to a corresponding pin on an electronic device, thereby communicating and sharing data with one another.

However, the connection relationships between the pins on the memory device and the pins on the electronic device are not unified. For example, any pin of the memory device may connect to any pin of the electronic device, resulting in different possible pin connection relationships between the memory device and electronic devices in different products.

It should be realized that the pin connection relationship between the memory device and the electronic device are used for the debugging tasks of the memory device. Conventionally, the pin connection relationship between the memory device and the electronic device can only be determined by an engineer using the hardware diagram of the memory device and that of the electronic device attached to the product being manufactured. However, if the hardware diagram is lost or erroneously drawn, it is very difficult to discern the correct pin connection relationship between the memory device and the electronic device. Accordingly, there is demand for improving existing techniques for determining correct pin connection relationships.

BRIEF SUMMARY OF THE INVENTION

A wire order testing method, apparatus, and electronic device are provided in the invention.

In a first aspect of the invention, a wire order testing method for determining pin connection relationships between a memory device and an electronic device is provided. The method includes the steps of: testing the memory device with at least one test pattern to obtain at least one first data; predicting at least one second data that is to be correspondingly obtained from the testing of the memory device with the at least one test pattern according to the mapping relationships between the test pattern and the pins of the memory device; and determining the pin connection relationships between the memory device and the electronic device according to the at least one first data and the at least one second data.

In a second aspect of the invention, an electronic device is provided, the electronic device comprising: a plurality of pins; a processing core; and a control port, wherein the pins are connected to a plurality of pins of a memory device on a one-to-one basis, and the control port is configured to connect a controlled port of the memory device, wherein the processing core is configured for: inputting at least one test pattern to the memory device via the control port to test the memory device, and obtain at least one first data from the pins; predicting at least one second data that is to be obtained from the testing of the memory device with at least one test pattern according to the mapping relationship between the test pattern and the pins of the memory device; and determining the connection relationships between the pins of the memory device and the electronic device according to the at least one first data and the at least one second data.

In a third aspect of the invention, a wire order testing apparatus for determining pin connection relationships between a memory device and an electronic device is provided. The apparatus includes a testing module, a prediction module, and a determination module. The testing module is configured to test the memory device with at least one test pattern to obtain at least one first data. The prediction module is configured to predict at least one second data that is to be obtained from the test with the test pattern according to the mapping relationship between the test pattern and the pins of the memory device. The determination module is configured to determine the pin connection relationships between the pins of the memory device and pins of the electronic device according to the at least one first data and the at least one second data.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
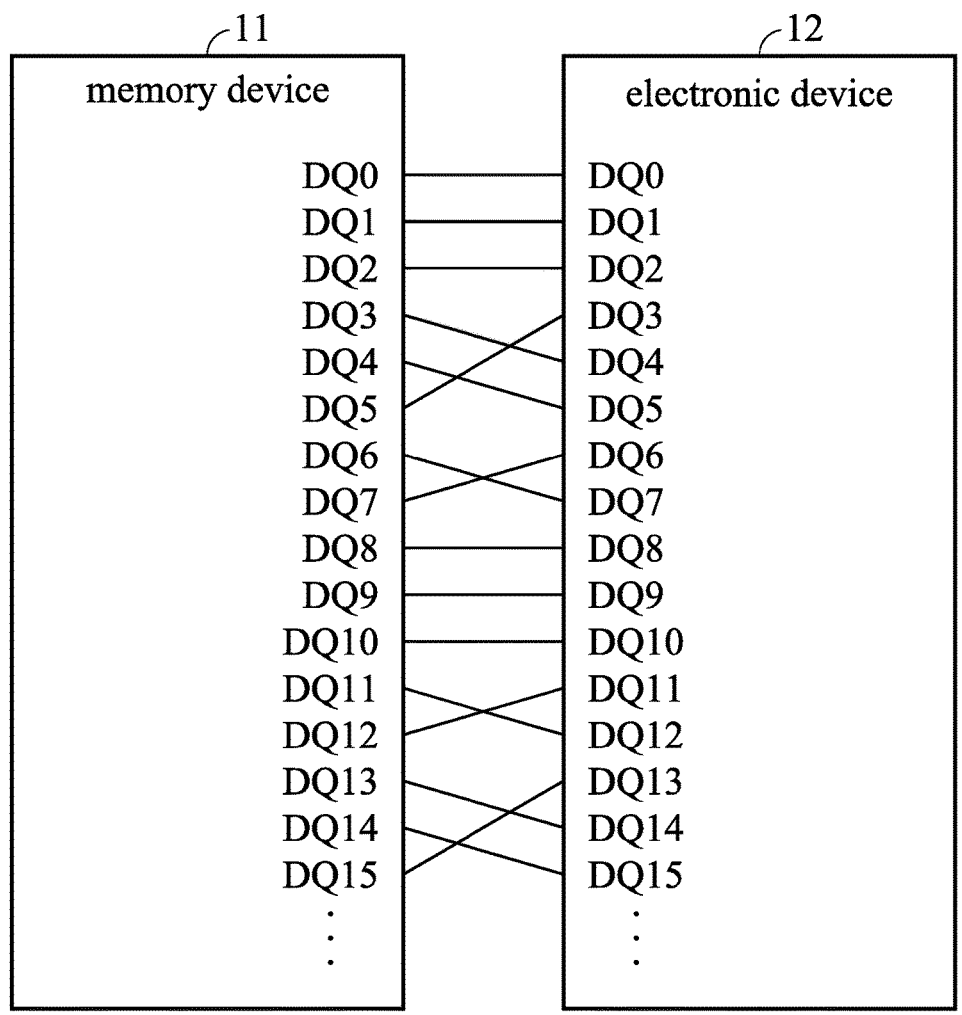
FIG. 1 is a diagram illustrating a scenario of pin connection relationships between a memory device and an electronic device in accordance with an embodiment of the invention.

FIG. 1 is a diagram illustrating a scenario of pin connection relationships between a memory device and an electronic device in accordance with an embodiment of the invention. Referring to FIG. 1, in an embodiment, the memory device 11 includes a plurality of pins such as pins DQ0-DQ15. The electronic device 12 includes a plurality of pins such as DQ0-DQ15. Each pin of the memory device 11 is connected to a corresponding pin of the electronic device, and thus the electronic device 12 may write data to the memory device 11 and read data from the memory device 11.

It should be noted that FIG. 1 is an example of a scenario of pin connection relationships between the memory device and the electronic device, and does not limit the pin connection relationships between the memory device and the electronic device of the invention. For example, referring to FIG. 1, the pin DQ4 of the memory device 11 is connected to the pin DQ5 of the electronic device. In another embodiment, the pin DQ4 of the memory device 11 is connected to pin DQ3 or another pin of the electronic device 12. In addition, it should be noted that a person skilled in the art does not know the pin connection relationship between the memory device 11 and the electronic device 12 without the hardware diagram or the wire order testing method of the invention. As shown in FIG. 1, the number of pins in the memory device 11 and electronic device 12 is 16. However, in other embodiments, the number of pins in the memory device 11 and electronic device 12 are not limited, and can be, for example, 8 or 32.

In an embodiment, the memory device 11 supports a command address training (CA training) function that is capable of sending specific CA test patterns to command address lines of the memory device and obtaining data corresponding to the CA test patterns from at least a portion of the pins on the memory device 11, thereby correcting the relationship between the clock signal and CA lines. For example, the memory device 11 may be a low-power double data rate synchronous dynamic random access memory (LPDDR SDRAM) such as an LPDDR3 SDRAM. The electronic device 12 may be a control system such as a system-on-chip (SoC). The electronic device 12 may also be any device capable of reading from and writing to the memory device 11.

When the hardware diagram is lost or erroneous, it is very difficult for a person skilled in the art to determine the wire order between the memory device 11 and the electronic device 12. A wire order testing method is provided in the invention for quickly and precisely testing the pin connection relationships between the memory device 11 and the electronic device 12.

Figure 2:
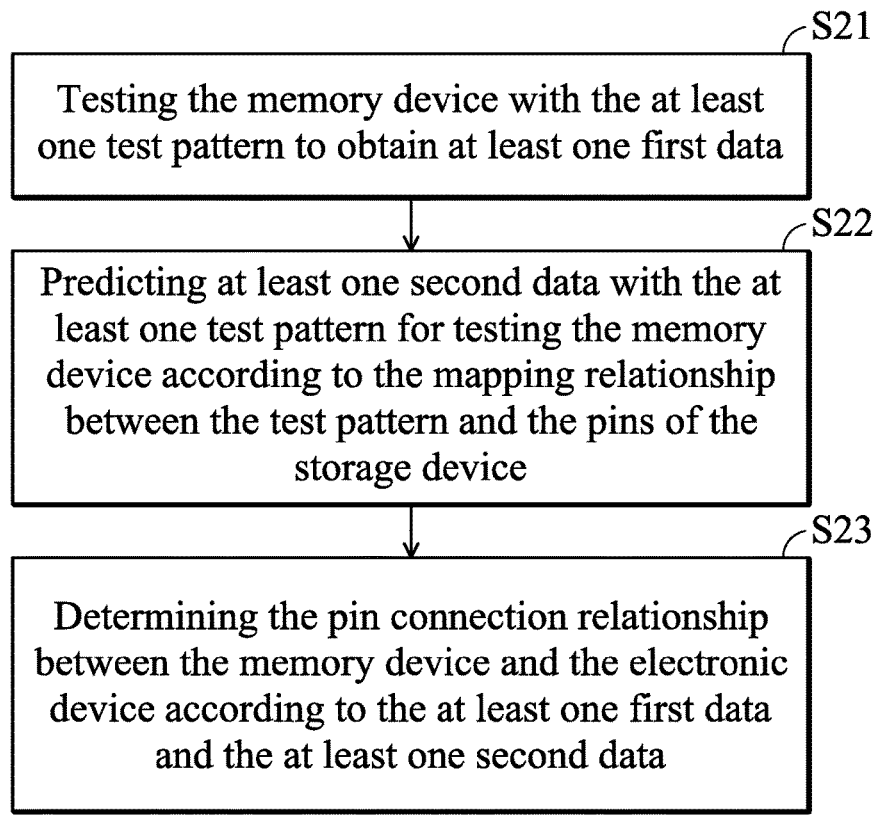
FIG. 2 is a flow chart of a wire order testing method in accordance with an embodiment of the invention.

FIG. 2 is a flow chart of a wire order testing method in accordance with an embodiment of the invention. Referring to FIG. 2, the wire order testing method can be performed by a wire order testing apparatus that can be integrated into the electronic device 12, or alternatively be stand-alone equipment separated from the electronic device. The wire order testing method includes the steps of:

S21: testing the memory device with the at least one test pattern to obtain at least one first data.

S22: predicting at least one second data with the at least one test pattern for testing the memory device according to the mapping relationship between the test pattern and the pins of the memory device.

S23: determining the pin connection relationship between the memory device and the electronic device according to the at least one first data and the at least one second data.

Because there are connection relationships between the pins of the memory device and the pins of the electronic device, the outgoing data from the pins of the memory device will be sent to the corresponding pins of the electronic device. In other words, during the test procedure, the connected pins on the memory device and the electronic device have the same data. Referring to FIG. 1, for example, the pin DQ0 on the memory device 11 and the pin DQ0 on the electronic device 12 have the same data. Accordingly, the pin connection relationships between the memory device and the electronic device can be quickly and precisely determined by comparing the first data obtained from the pins of the electronic device during the test and the second data predicted according to the mapping relationship.

In step S21, each test pattern may include a plurality of test symbols. The test symbols can be classified into first-type test symbols and second-type test symbols. For example, in an embodiment, a plurality of voltage values are used as the test symbols, and the input voltage of 0V belongs to the first-type test symbols, and the input voltages of −5V and 5V belong to the second-type test symbols. In another embodiment, binary symbols are used as the test symbols, wherein the first-type test symbol can be "0" in binary, and the second-type test symbol can be "1" in binary. Alternatively, the first-type test symbol can be "1" in binary, and the second-type test symbol can be "0" in binary.

In step S21, the first data is the data obtained from the pins on the electronic device, wherein each test pattern corresponds to one of the first data.

In step S21, the testing is performed using CA training. In some embodiments, the testing can be performed in other ways which can present desired data on the pins of the memory device when inputting test patterns to the memory device.

Figure 3:
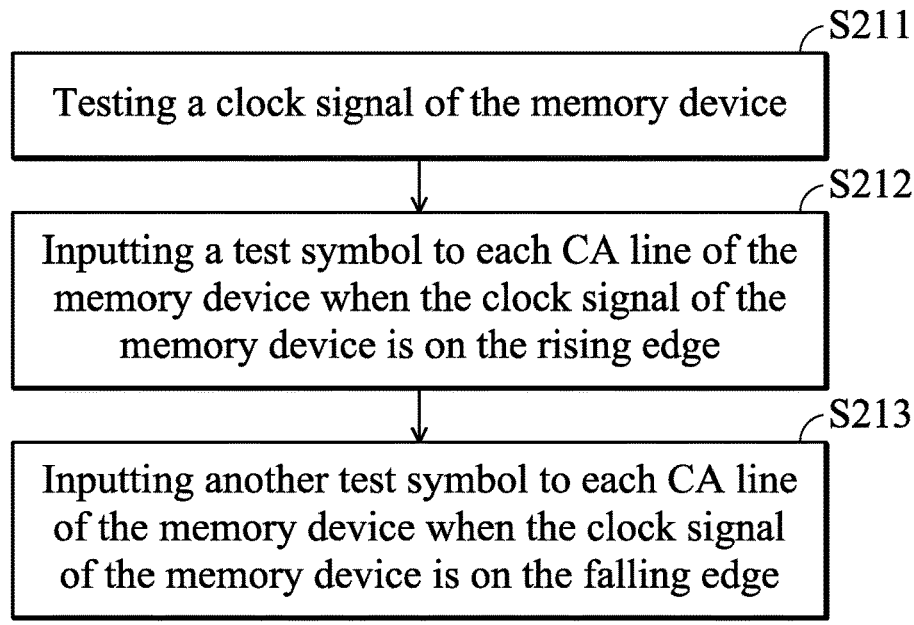
FIG. 3 is a flow chart of step S21 in the wire order testing method in the embodiment of FIG. 2.

In the embodiment using CA training, every two test symbols in the test patterns can be used as the input of a CA line so as to increase the usage rate of every CA line. FIG. 3 is a flow chart of step S21 in the wire order testing method in the embodiment of FIG. 2. Step 21 includes the sub-steps of:

S211: testing (detecting) a clock signal of the memory device.

S212: inputting a test symbol to each CA line of the memory device when the clock signal of the memory device is on the rising edge.

S213: inputting another test symbol to each CA line of the memory device when the clock signal of the memory device is on the falling edge.

For example, the CA line CA0 in the memory device is for testing the data lines DQ0 and DQ1 on the memory device. After satisfying the setup timing, the wire order testing apparatus inputs a test symbol corresponding to the data line DQ0 to the CA line CA0 when the clock signal of the memory device is on the rising edge, and inputs another test symbol corresponding to the data line DQ1 to the CA line CA0 when the clock signal of the memory device is on the falling edge. Accordingly, the usage of the CA line of the memory device can be increased.

Figure 4:
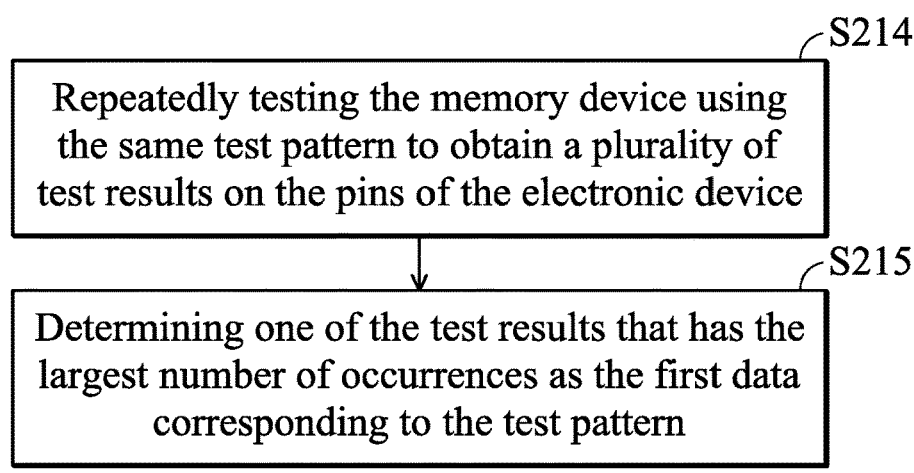
FIG. 4 is a flow chart of step S21 in the wire order testing method in the embodiment of FIG. 2.

FIG. 4 is a flow chart of step S21 in the wire order testing method in the embodiment of FIG. 2. To ensure the correctness of the testing, step S21 includes the sub-steps of:

S214: repeatedly testing the memory device using the same test pattern to obtain a plurality of test results on the pins of the electronic device.

S215: determining one of the test results that have the largest number of continuous occurrences as the first data corresponding to the test pattern.

In the embodiment, the same test pattern can be used repeatedly to test the memory device to obtain a plurality of test results. The most appropriate test result is selected from the test results as the resulting test data, thereby reducing the distortion rate of the resulting testing data to ensure the correctness of the resulting test data.

In another embodiment, after obtaining the first data from the electronic device, the wire order testing apparatus may determine whether the first data is valid. For example, the wire order testing apparatus may determine whether the number of first-type test symbols in the first data matches the number of first-type test symbols in the test pattern. If the numbers match, it is determined that the first data is valid, and step S22 is performed. Otherwise, it is determined that the first data is invalid, and the test procedure is performed again using the same test pattern, or an alarm is generated to indicate a malfunction of the memory device.

In step S22, the second data can be regarded as the data output from the pins of the memory device after inputting the at least one test pattern to the memory device. The second data can be obtained according to the mapping relationship between the test pattern and the pins of the memory device. That is, the second data can be obtained without the actual test procedure.

Figure 5:
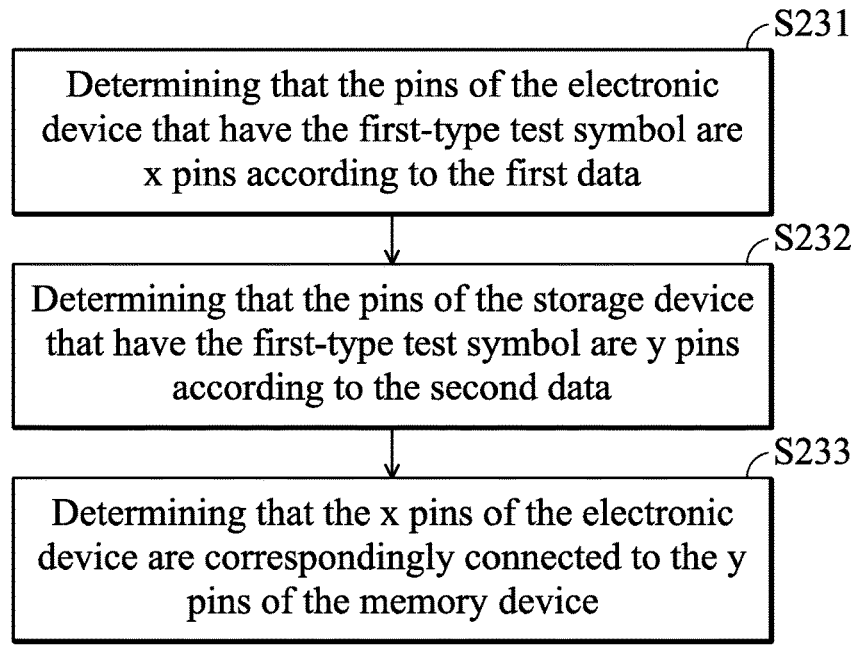
FIG. 5 is a flow chart of step S23 in the wire order testing method in the embodiment of FIG. 2.

FIG. 5 is a flow chart of step S23 in the wire order testing method in the embodiment of FIG. 2. Referring to FIG. 5, only one of the test symbols in the test pattern is a first-type test symbol, and the other test symbols are second-type test symbols. In step S23, for each test pattern, the connection relationship between one pin of the memory device and one of the pins of the electronic device can be determined according to the corresponding first data and second data. Specifically, step S23 includes the sub-steps of:

S231: determining that the pins of the electronic device that have the first-type test symbol are x pins according to the first data.

S232: determining that the pins of the memory device that have the first-type test symbol are y pins according to the second data.

S233: determining that the x pins of the electronic device are correspondingly connected to the y pins of the memory device.

The first-type test symbol may be "1" in binary, and the second-type test symbol may be "0" in binary. In the embodiment, each test pattern may include only one "1" or only one "0", wherein the numbers of x pins and y pins are positive integers.

In the embodiment, the test patterns only include one first type test symbol, and thus the connection relationship between one pin of the memory device and one pin of the electronic device can be determined with one test pattern. Accordingly, after performing the test for each pin under test of the memory device, the connection relationships between the memory device and the electronic device can be determined. In addition, the pin relationship between one pin of the memory device and one pin of the electronic device by each test can be determined according to the first-type test symbol, thereby reducing the complexity of the test procedure.

In an embodiment, taking CA training tests for example, the wire order testing apparatus inputs test patterns to CA lines of the memory device to perform CA training tests. Each CA line corresponds to different pins on the rising edge and falling edge of the clock signal of the memory device, and the pins corresponding to each CA line in the memory device outputs the input test symbol inputted to the CA line. In the embodiment, eight CA lines CA0-CA3 and CA5-CA8 are used to perform the test. The mapping relationship of the CA lines and the pins DQ0-DQ15 in the memory device are illustrated in table 1:

TABLE 1

| CA0 | CA1 | CA2 | CA3 | CA5 | CA6 | CA7 | CA8 | Clock signal |
|-----|-----|-----|-----|-----|-----|-----|-----|-----|
| DQ0 | DQ2 | DQ4 | DQ6 | DQ8 | DQ10 | DQ12 | DQ14 | Rising edge |
| DQ1 | DQ3 | DQ5 | DQ7 | DQ9 | DQ11 | DQ13 | DQ15 | Falling edge |

In Table 1, taking the CA line CA0 for example, when the clock signal is on the rising edge, the input test symbol to the CA line CA0 is output from the pin DQ0 of the memory device. When the clock signal is on the falling edge, the input test symbol to the CA line CA0 is output from the pin DQ1 of the memory device. That is, assuming that the test symbol "0" is inputted to the CA line CA0 on the rising edge of the clock signal, the test symbol "0" will appear on the pin DQ0, and the test symbol "0" will also appear on the pin of the electronic device that is connected to the pin DQ0 of the memory device.

While performing tests with test patterns, the wire order testing apparatus obtains the first data output from the electronic device 12 and the second data output from the memory device 11. For example, the first data that is formed by outputs of the pins DQ0-DQ15 of the electronic device 12 may be 0x0001, and the second data that is formed by the pins DQ0-DQ15 of the memory device 11 with the test patterns may be 0x0001. Thus, it is determined that there is a connection relationship between the pin DQ0 on the electronic device 12 and the pin DQ0 on the memory device 11. It should be noted that, although the connection relationship between the memory device 11 and electronic device 12 is unknown before the test, the pin order on the electronic device 12 should already be known to a person skilled in the art. Thus, the signal on each pin on the electronic device 12 can be tested during the test procedure.

In an embodiment, 16 different test patterns are used by the wire order testing apparatus to perform the test, thereby obtaining the connection relationship between 16 pins on the electronic device 12 and 16 pins on the memory device 11. The aforementioned test can be expressed by Table 2:

TABLE 2

| CA line for inputting first-type test symbol | test pattern | Clock signal | first data | Memory device pin | Electronic device pin |
|---|---|---|---|---|---|
| CA0 | 0x0001 | rising edge | 0x0001 | DQ0 | DQ0 |

TABLE 2-continued

| CA line for inputting first-type test symbol | test pattern | Clock signal | first data | Memory device pin | Electronic device pin |
|---|---|---|---|---|---|
|  | 0x0002 | falling edge | 0x0002 | DQ1 | DQ1 |
| CA1 | 0x0004 | rising edge | 0x0004 | DQ2 | DQ2 |
|  | 0x0008 | falling edge | 0x0010 | DQ3 | DQ4 |
| CA2 | 0x0010 | rising edge | 0x0020 | DQ4 | DQ5 |
|  | 0x0020 | falling edge | 0x0008 | DQ5 | DQ3 |
| CA3 | 0x0040 | rising edge | 0x0080 | DQ6 | DQ7 |
|  | 0x0080 | falling edge | 0x0040 | DQ7 | DQ6 |
| CA5 | 0x0100 | rising edge | 0x0100 | DQ8 | DQ8 |
|  | 0x0200 | falling edge | 0x0200 | DQ9 | DQ9 |
| CA6 | 0x0400 | rising edge | 0x0400 | DQ10 | DQ10 |
|  | 0x0800 | falling edge | 0x1000 | DQ11 | DQ12 |
| CA7 | 0x1000 | rising edge | 0x0800 | DQ12 | DQ11 |
|  | 0x2000 | falling edge | 0x4000 | DQ13 | DQ14 |
| CA8 | 0x4000 | rising edge | 0x8000 | DQ14 | DQ15 |
|  | 0x8000 | falling edge | 0x2000 | DQ15 | DQ13 |

It should be noted that 15 different test patterns are used by the wire order testing apparatus to perform the aforementioned test to obtain the connection relationship between 16 pins on the electronic device 12 and 16 pins on the memory device 11. For example, after determining the connection relationship between 15 pins on the electronic device 12 and 15 pins on the memory device 11 using 15 test patterns, the connection relationship of the remaining pin on the electronic device 12 and the remaining pin on the memory device 11 can be determined.

Similarly, given that the first-type test symbol is "0" and the second-type test symbol is "1" and each test pattern only includes one "0", the wire order testing apparatus can determine the pin connection relationships between the memory device 11 and the electronic device 12 after inputting a test pattern to obtain the first data. The input test patterns are illustrated in Table 3:

TABLE 3

| CA line for inputting first-type test symbol | test pattern | Clock signal |
|---|---|---|
| CA0 | 0xFFFE | rising edge |
|  | 0xFFFD | falling edge |
| CA1 | 0xFFFB | rising edge |
|  | 0xFFF7 | falling edge |
| CA2 | 0xFFEF | rising edge |
|  | 0xFFDF | falling edge |
| CA3 | 0xFFBF | rising edge |
|  | 0xFF7F | falling edge |
| CA5 | 0xFEFF | rising edge |
|  | 0xFDFF | falling edge |
| CA6 | 0xFBFF | rising edge |
|  | 0xF7FF | falling edge |
| CA7 | 0xEFFF | rising edge |
|  | 0xDFFF | falling edge |
| CA8 | 0xBFFF | rising edge |
|  | 0x7FFF | falling edge |

Accordingly, the wire order testing apparatus may use the CA training mode existing in the memory device 11, which is used to correct the relationship between the clock signal and command lines, to obtain the wire order between the memory device 11 and the electronic device 12. Thus, testing for the wire order of the memory device 11 can be performed without any modification.

Figure 6:
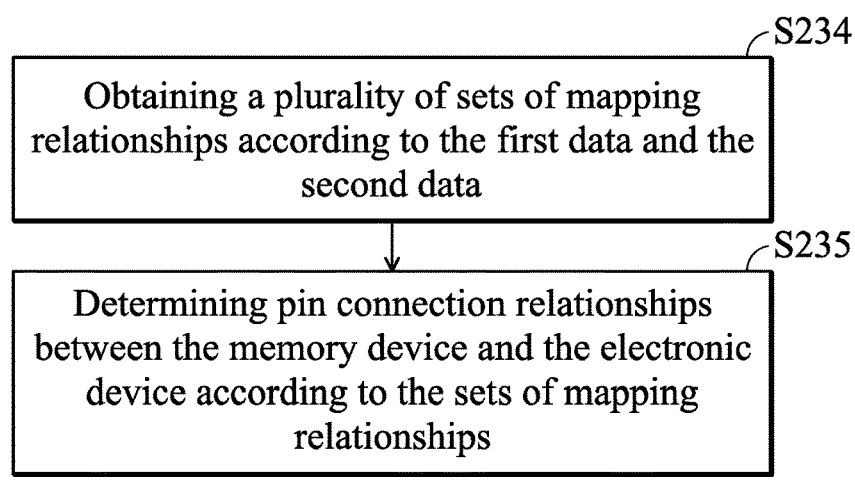
FIG. 6 is a flow chart of step S23 in the wire order testing method in the embodiment of FIG. 2.

FIG. 6 is a flow chart of step S23 in the wire order testing method in the embodiment of FIG. 2. Referring to FIG. 6, the test symbols in the test patterns include at least two first-type test symbols and at least two second-type test symbols. The test pattern in step S21 denotes a plurality of test patterns that are used in the testing to obtain a plurality of first data and a plurality of expected second data. Specifically, step 23 includes the sub-steps of:

S234: obtaining a plurality of sets of mapping relationships according to the first data and the second data.

Specifically, step S234 may include the steps of: determining a plurality of first pins having the first-type test symbol from the pins of the electronic device according to one of the first data; determining a plurality of second pins having the first-type test symbol from the pins of the memory device according to one of the second data; determining a set of mapping relationships, wherein the set of mapping relationships indicates that the first pins and the second pins have connection relationships.

S235: determining pin connection relationships between the memory device and the electronic device according to the sets of mapping relationships.

Each set of mapping relationships indicates that there are connection relationships between a portion of pins on the electronic device and a portion of pins on the memory device. For example, the first data obtained from the pins DQ0-DQ15 of the electronic device 12 is 0x0111, and the second data obtained from the pins DQ0-DQ15 of the memory device 11 is 0x0405. Thus, it is determined that the pins DQ0, DQ4, and DQ8 of the electronic device 12 have connection relationships with the pins DQ0, DQ1, and DQ9 of the memory device 11, but the detailed connection relationships cannot be determined for each of the pins DQ0, DQ4, and DQ8 of the electronic device 12 and for each of the pins DQ0, DQ1, and DQ9 of the memory device 11. Thus, multiple sets of connection relationships are required to determine the detailed pin connection relationships between the memory device 11 and the electronic device 12. For example, a set of pin connection relationships indicates that the pin DQ0 of the memory device 11 is connected to the pins DQ1, DQ3, and DQ5 of the electronic device 12, and another set of pin connection relationships indicates that the pin DQ0 of the memory device 11 is connected to the pins DQ3, DQ7, and DQ9. Accordingly, it can be determined that the pin DQ0 of the memory device 11 is actually connected to the pin DQ3 of the electronic device 12.

In an embodiment, the details for designing test patterns and how to perform the test are described.

For example, each test pattern includes n first-type test symbols and k second-type test symbols, wherein n and k are positive integers greater than 2. The number of pins under test in the memory device 11 and the electronic device 12 are m, and the value of m can be defined according to different memory devices. For example, given that the number of pins for connecting to the electronic device 12 in the memory device 11 is 8, the number of pins under test can be set to 8. Alternatively, the number of CA lines for testing in the memory device 11 is 8, and the number of corresponding pins is 16, and thus, the number of pins under test can be set to 16. Generally, the value of m is greater than or equal to the sum of n and k.

The wire order testing apparatus performs j times test with different test patterns, wherein the value of j is an integer that is closest to $\sqrt{m}$, and j may be equal to or greater than $\sqrt{m}$. The test patterns for the i-th test denote the test patterns in the i-th level.

The test pattern in each level satisfies the following conditions:

Exclusive condition: any two test patterns of test patterns in each level cannot be the first-type test symbol at the same location (i.e. pin);

Complementary condition: when the first-type test symbol is "1", the summation of the "1" bits in all test patterns in each level is 0xffff; when the first-type test symbol is "0", the summation of the "0" bits in each level is 0xffff.

2N division condition: child nodes evenly divide the bit in the first-type test symbol of the parent node. That is, each test pattern (i.e. parent node) in the upper level is equal to the summation of two test patterns (i.e. child node) in the next level, and the numbers of first-type test symbols in the two test patterns in the next level are equal.

Figure 7:
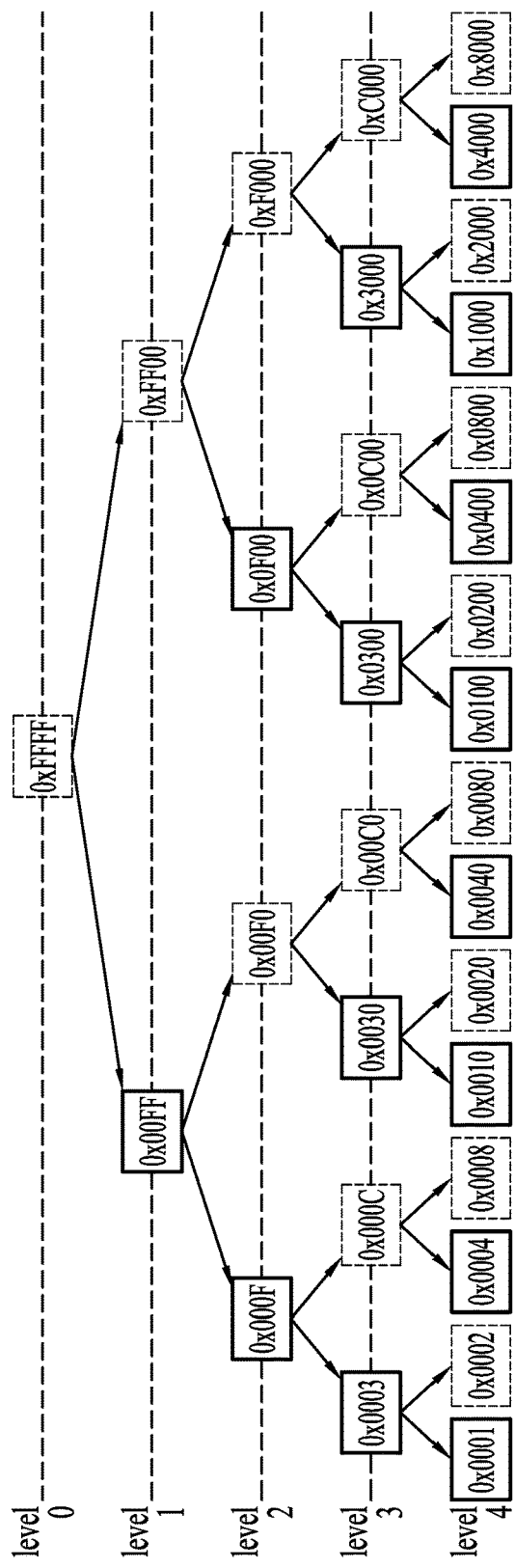
FIG. 7 is a diagram illustrating a scenario including test patterns used in the wire order testing method in accordance with an embodiment of the invention.
Figure 9:
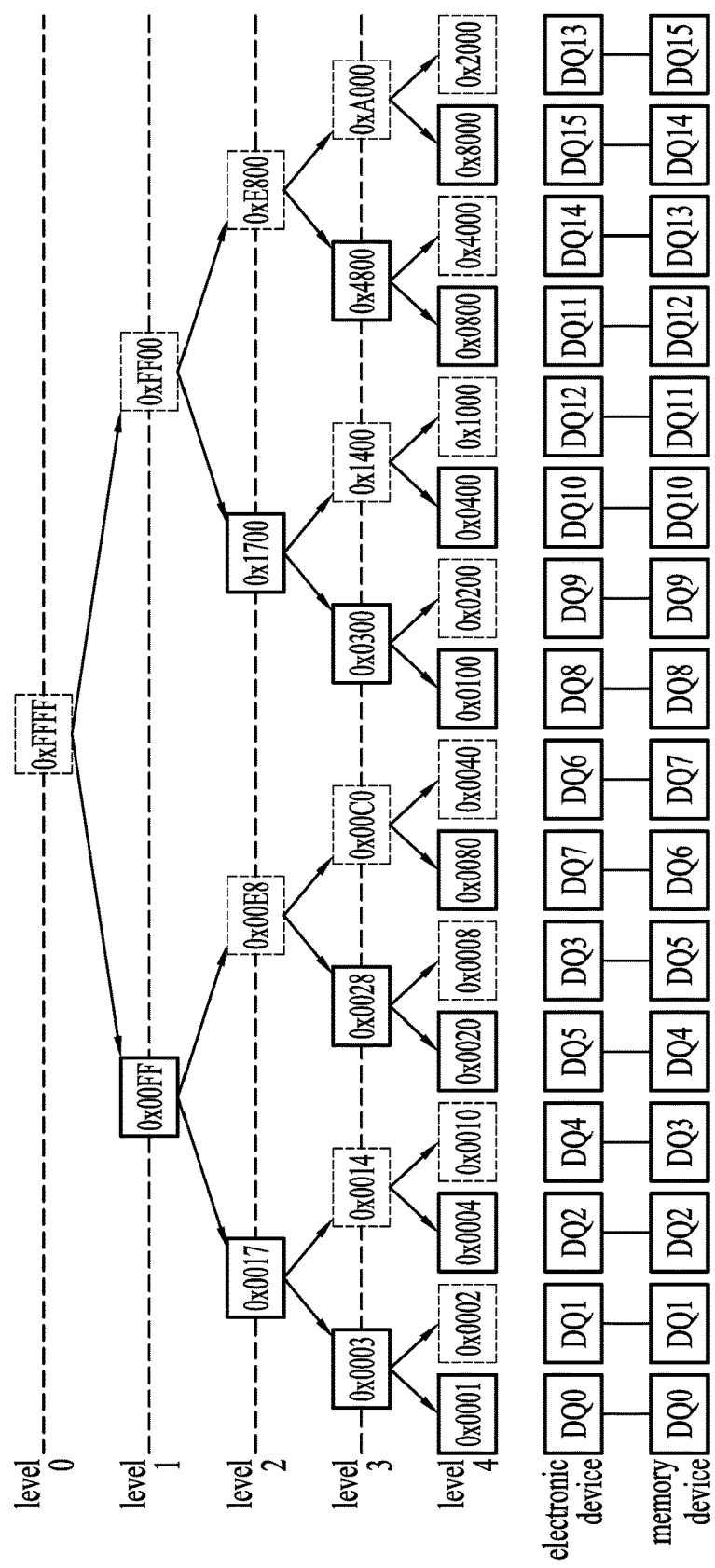
FIG. 9 is a diagram of the first data obtained from the test with the test patterns in accordance with the embodiment of FIG. 7.

The detailed testing methods are described with the following examples:

Example (1)

the step of testing the memory device with test patterns for the i-th time includes the sub-steps of:

Sequentially testing the memory device with $2^{i-1}$ test patterns in the i-th level, wherein i is an integer between 1 and j. Each test pattern in the i-th level includes $m/2^i$ first-type test symbol and $(m-m/2^i)$ second-type test symbol in the test patterns in the (i−1)th level, or includes $m/2^i$ first-type test symbol and $(m-m/2^i)$ second-type test symbol in the supplementary patterns in the (i−1)th level; the location of the first-type test symbol in the test patterns in the (i−1)th level is different from that in the supplementary patterns in the (i−1)th level, and the test pattern in level 0 includes m first-type test symbols. It is not necessary to input the supplementary patterns to the memory device to perform the tests. Test pattern in each level are illustrated in FIG. 7, where the blocks with solid lines are test patterns, and the blocks with dotted lines are supplementary patterns, and the first-type test symbol is "1" in binary. For each test pattern, the second data obtained from the output of the pins DQ0-DQ15 of the memory device are the same as the test patterns, as shown in FIG. 7. The first data obtained from the output of the pins DQ0-DQ15 of the electronic device after inputting a test pattern each time are shown in FIG. 9.

Figure 10:
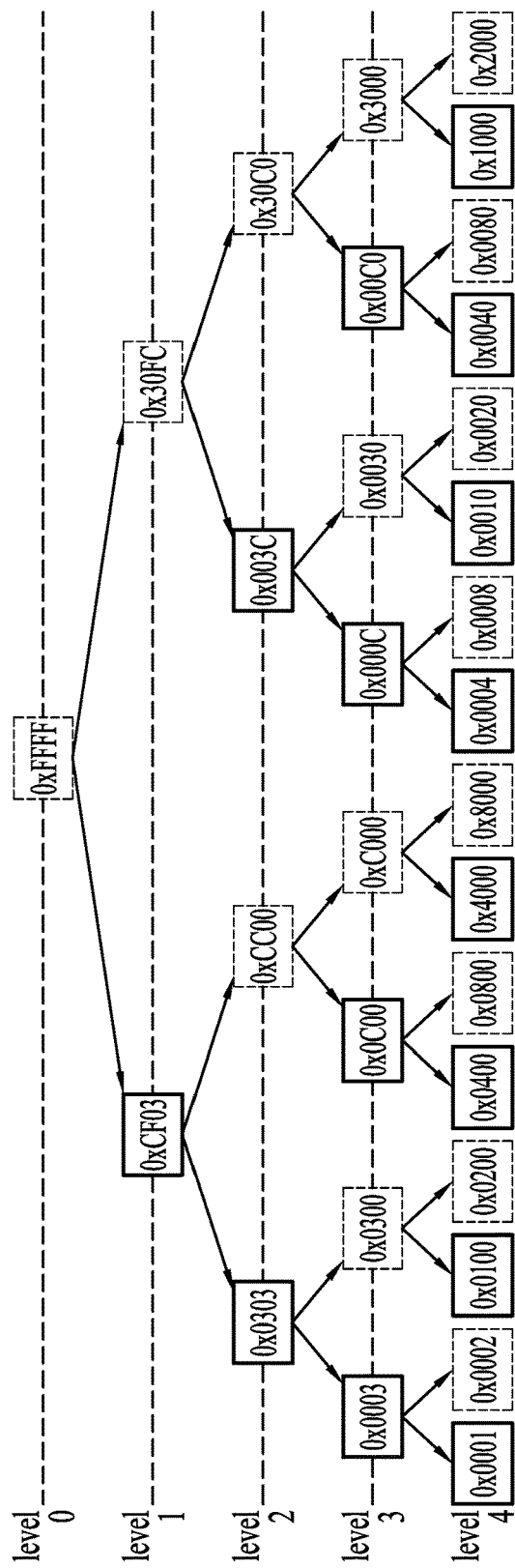
FIG. 10 is a diagram illustrating another scenario including test patterns used in the wire order testing method in accordance with an embodiment of the invention.

Example (2)

the step of testing the memory device with test patterns for the i-th time includes the sub-steps of:

Testing the memory device with one test pattern in the i-th level, wherein i is an integer between 1 and j. The test patterns in the i-th level includes $m/2^i$ first-type test symbols in the test patterns in the (i−1)th level, and $m/2^i$ first-type test symbols and $(m-2\ m/2^i)$ second-type test symbols in the supplementary patterns in the (i−1)th level. The location of the first-type test symbol in the test patterns in the (i−1) level is different from that in the supplementary patterns in the (i−1) level, and the test patterns in level 0 includes m first-type test symbols. FIG. 10 is a diagram illustrating another scenario including test patterns used in the wire order testing method in accordance with an embodiment of the invention. As shown in FIG. 10, the blocks with solid lines are test patterns used in the first testing method, and the blocks with dotted lines are supplementary patterns used in the first testing method, and the first-type test symbols are "1" in binary. In FIG. 10, the summation of test patterns in blocks with solid lines in each level is the test pattern for each level in the second testing method. For example, the test pattern in level 1 is 0xCF03, and the test pattern in level 2 is 0x033F, and the test pattern in level 3 is 0x0CCF, and the test pattern in level 4 is 0x5555.

Figure 8:
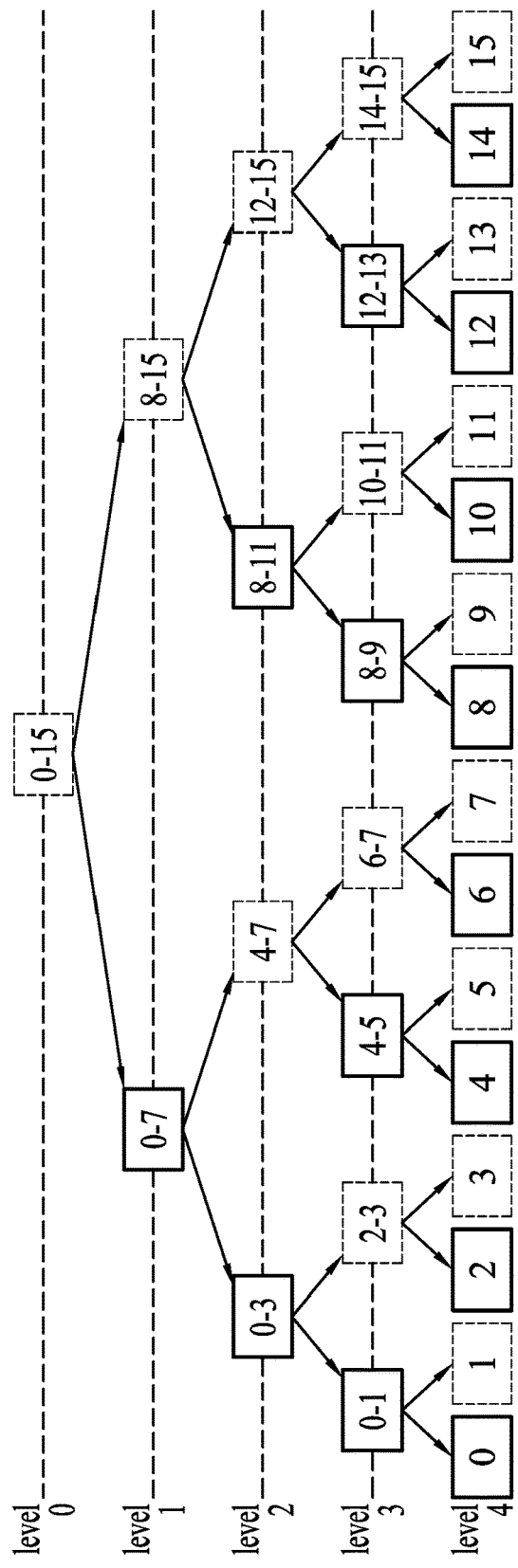
FIG. 8 is a diagram of the determined pins of the memory device corresponding to the test patterns in accordance with the embodiment of FIG. 7.

The wire order testing apparatus obtains the first data and the second data according to different test patterns. For example, $m/2^i$ pins having the first-type test symbol on the electronic device can be determined by the first data obtained from the test patterns in the i-th level. The $m/2^i$ pins having the first-type test symbol on the memory device can be determined by the second data obtained from the test patterns in the i-th level. As shown in FIG. 8, for each corresponding test pattern in FIG. 7, the pins having the first-type test symbol on the memory device can be determined. Accordingly, the connection relationships between the $m/2^i$ pins on the memory device and the $m/2^i$ pins on the electronic device can be determined, and the connection relationships between the remaining $(m-m/2^i)$ pins on the memory device and the remaining $(m-/2^i)$ pins on the electronic device can also be determined. Thus, the plurality of sets of connection relationships can be obtained according to the first data and second data.

After obtaining the plurality of sets of connection relationships, the connection relationship between each pin of the memory device and each pin of the electronic device can be determined because the pins in each set of connection relationships is different. Specifically, given that i starts from 1 to j, and the $m/2^{i-1}$ pins of the memory device and the electronic device have connection relationships with determined test patterns in the (i−1)th level, the connection relationships of $m/2^{i-1}-m/2^i$ pins other than the $m/2^{i-1}$ pins having connection relationships in the memory device and the electronic device with test patterns in the i-th level is determined. The aforementioned step is performed repeatedly until i is equal to j, and thus the connection relationships of m pins of the memory device and m pins of the electronic device under test can be determined.

Referring to FIGS. 7-9, the connection relationships between the pins DQ0-DQ7 of the memory device and the pins DQ0-DQ7 of the electronic device and the connection relationships between the pins DQ8-DQ15 of the memory device and the pins DQ8-DQ15 of the electronic device can be determined based on the test patterns in the first level. The connection relationships between the pins DQ0-DQ3 of the memory device and the pins DQ0-DQ2 and DQ4 of the electronic device, the pins DQ4-DQ7 of the memory device and the pins DQ3 and DQ5-DQ7 of the electronic device, the pins DQ8-DQ11 of the memory device and the pins DQ8-DQ10 and DQ12 of the electronic device, and the pins DQ12-DQ15 of the memory device and the pins DQ11 and DQ13-DQ15 of the electronic device can be determined based on the test patterns in the second level. The connection relationships between the pins DQ0-DQ1 of the memory device and the pins DQ0-DQ1 of the electronic device, the pins DQ2-DQ3 of the memory device and the pins DQ2 and DQ4 of the electronic device, the pins DQ4-DQ5 of the memory device and the pins DQ3 and DQ5 of the electronic device, the pins DQ6-DQ7 of the memory device and the pins DQ6-DQ7 of the electronic device, the pins DQ8-DQ9 of the memory device and the pins DQ8-DQ9 of the electronic device, the pins DQ10-DQ11 of the memory device and the pins DQ10 and DQ12 of the electronic device, the pins DQ12-DQ13 of the memory device and the pins DQ11 and DQ14 of the electronic device, the pins DQ14-DQ15 of the memory device and the pins DQ13 and DQ15 of the electronic device are based on the test patterns in the third level. The connection relationship between the pins DQ0-DQ15 of the memory device and the pins DQ0-DQ2, DQ4, DQ5, DQ3, DQ7, DQ6, DQ8-DQ10, DQ12, DQ11, DQ14, DQ15, DQ15 of the electronic device can be determined based on the test patterns in the fourth level.

It should be understood that the test patterns in each level are not limited by FIG. 7 and FIG. 10, and the test patterns in each level can be a set of symbols that satisfy the aforementioned exclusive, complementary, and 2N division conditions.

Figure 11:
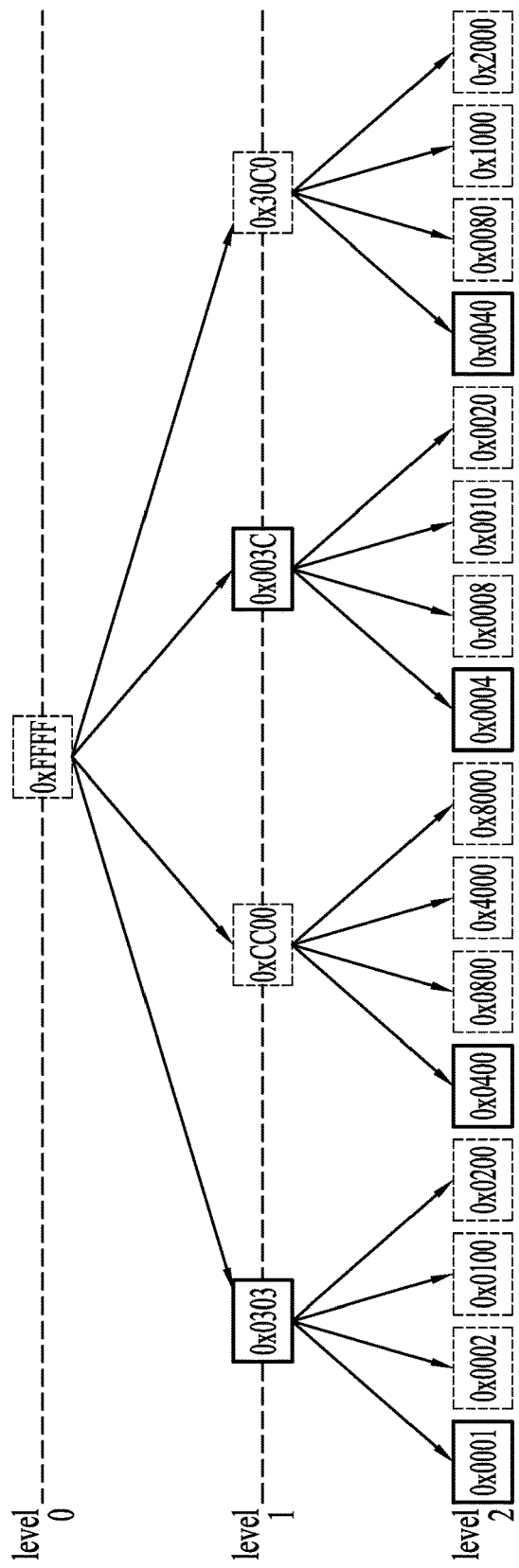
FIG. 11 is a diagram illustrating yet another scenario including test patterns used in the wire order testing method in accordance with an embodiment of the invention.

In addition, each test pattern is divided into two portions (i.e. 2N division, and N=1) in the aforementioned embodiment. In other embodiments, each test pattern can be divided into four portions (i.e. 2N division, and N=2), and thus the wire order testing apparatus can perform tests based on the test patterns in the even-numbered level. As shown in FIG. 11, the blocks with solid lines are test patterns, and the blocks with dotted lines are supplementary patterns. It should be understood that each test pattern can be divided in other ways, and the number N can be any positive integer. Accordingly, the wire order testing apparatus should perform $z=\sqrt[2N]{m}$ tests, wherein the i-th test is performed with the test patterns in the i-th level, where i is an integer between 1 and z. Each test pattern in the i-th level includes $m/(2N)^i$ first-type test symbols and $m-m/(2N)^i$ second-type test symbols in the (i−1)th level, or includes $m/(2N)^i$ first-type test symbols and $m-m/(2N)^i$ second-type test symbols in the supplementary patterns in the (i−1)th level.

Figure 12:
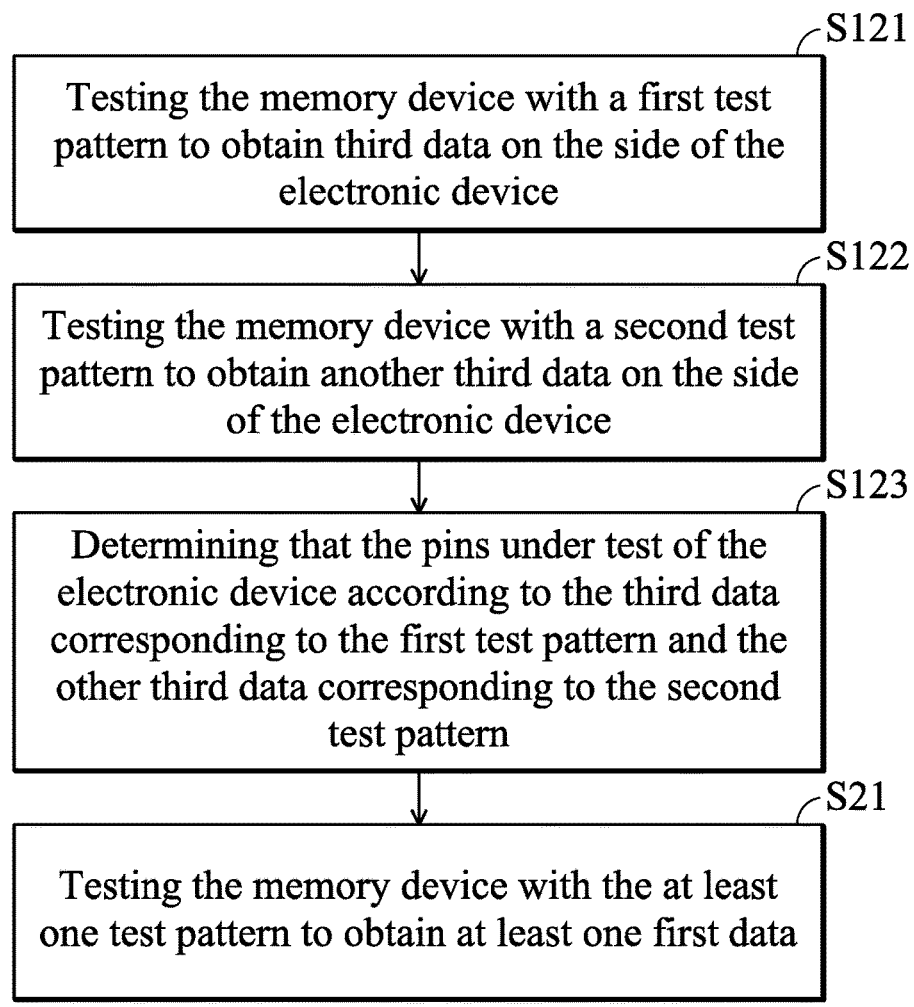
FIG. 12 is a portion of a flow chart of the wire order testing method in accordance with another embodiment of the invention.

FIG. 12 is a portion of a flow chart of the wire order testing method in accordance with another embodiment of the invention. Referring to FIG. 12, in an embodiment, step S21 in the aforementioned embodiment further includes steps S121, S122, and S123, and steps S121, S122, and S123 are described in detail below:

S121: testing the memory device with a first test pattern to obtain third data on the side of the electronic device.

S122: testing the memory device with a second test pattern to obtain another third data on the side of the electronic device.

The test symbols in the first/second test pattern are the same, but the test symbols in the first test pattern are different from those in the second test pattern. For example, the first test pattern includes a plurality of first-type test symbols, and the second test pattern includes a plurality of second-type test symbols.

S123: determining that the pins under test of the electronic device according to the third data corresponding to the first test pattern and the other third data corresponding to the second test pattern.

For example, when the test symbols in the third data are the same as those in the first test pattern, such as being the first-type test symbols, and when the test symbols in the other third data are the same as those in the second test pattern, such as being the second-type test symbols, it is determined that the pins of the electronic device that are corresponding to the first-type test symbols in the third data and the second-type test symbols in the other third data as the pins under test of the electronic device, and step S21 is performed.

For example, given that the default output of the pins in the memory device is "0", two test patterns "0xFFFF" and 0x0000 are used for the tests and the output value 0xFFFF and 0x0000 can be obtained from the pins DQ0-DQ15 of the electronic device. Thus, outputs of the 16 pins of the electronic device are tested by the test patterns of the memory device, and thus it can be determined that the memory device is operating normally. Accordingly, the testing method in FIGS. 2-6 can be performed to determine that the 16 pins DQ0-DQ15 are the pins under test of the electronic device based on the non-default output value 0xFFFF.

Figure 13:
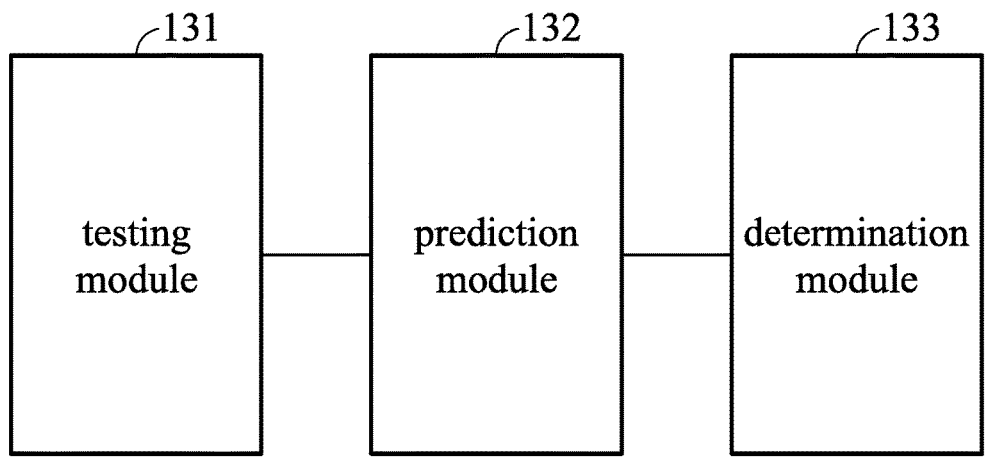
FIG. 13 is a schematic diagram of the wire order testing apparatus in accordance with an embodiment of the invention.

FIG. 13 is a schematic diagram of the wire order testing apparatus in accordance with an embodiment of the invention. Referring to FIG. 13, the wire order testing apparatus 13 is configured to test pin connection relationships between the pins of the memory device and the electronic device. The wire order testing apparatus 13 includes a testing module 131, a prediction module 132, and a determination module 133 and the testing module 131, prediction module 132, and determination module 133 can implemented by a processor.

The testing module 131 is configured to test the memory device with at least one test pattern to obtain at least one first data.

The prediction module 132 is configured to predict at least one second data that is to be obtained from the test with the at least one test pattern according to the mapping relationship between the test pattern and the pins of the memory device.

The determination module 133 is configured to determine the connection relationships between the pins of the memory device and the electronic device according to the at least one first data and the at least one second data.

Alternatively, the testing module 131 can be used to perform CA training tests on the memory device with at least one test pattern.

Alternatively, the test pattern includes a plurality of test symbols, and one of the test symbols is the first-type test symbol and the other test symbols are the second-type test symbols.

Specifically, the determination module 133 is configured to determine that pins of the electronic device that have the first-type test symbol are x pins according to the first data; determine that pins of the memory device that have the first-type test symbol are y pins according to the second data; and determine that the x pins of the electronic device are connected to the y pins of the memory device.

Alternatively, the test pattern includes a plurality of test symbols, and at least two of the test symbols are first-type test symbols, and at least two of the test symbols are second-type test symbols, wherein the test patterns, the first data, and the second data are plural.

Specifically, the determination module 133 is configured to obtain a plurality of sets of connection relationships according to the first data and the second data; and determine the pin connection relationships between the pins of the memory device and those of the electronic device according to the sets of connection relationships, wherein each set of connection relationships indicates that there are connection relationships between a portion of the pins of the electronic device and a portion of the pins of the memory device.

Each of the aforementioned modules of the wire order testing apparatus are for performing an individual step in the aforementioned embodiment, and the details can be found in the aforementioned embodiment, so the details will not be repeated here. The aforementioned wire order testing apparatus may be the electronic device 12 in FIG. 1, or a partial circuit in the electronic device 12.

Figure 14:
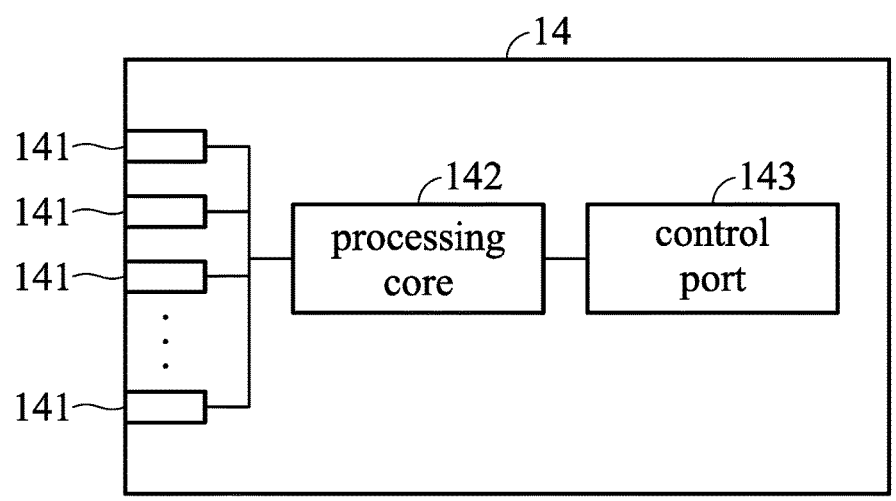
FIG. 14 is a schematic diagram of the electronic device accordance with an embodiment of the invention.

FIG. 14 is a schematic diagram of the electronic device in accordance with an embodiment of the invention. Referring to FIG. 14, there are pin connection relationships between the electronic device 14 and the memory device. The electronic device 14 comprises a plurality of pins 141, a processing core 142, and a control port 143.

The pins 141 are connected to the pins of the memory device on a one-to-one basis, and the connection relationships can be referred to in FIG. 1.

The control port 143 is connected to a controlled port of the memory device. In an embodiment, the controlled port of the memory device is the CA line interface of the memory device, and the control port 143 is the interface that inputs signals to the CA line interface of the memory device.

The processing core 142 is configured to: input at least one test pattern to the memory device via the control port 143 to test the memory device, and obtain at least one first data from the pins 141; predict at least one second data that is to be obtained from the test with at least one test pattern according to the mapping relationship between the test pattern and the pins of the memory device; and determine the connection relationships between the pins of the memory device and the electronic device according to the at least one first data and the at least one second data.

Alternatively, the processing core 142 can be used to perform CA training tests on the memory device with at least one test pattern.

Alternatively, the test pattern includes a plurality of test symbols, and one of the test symbols is the first-type test symbol and the other test symbols are the second-type test symbols.

Specifically, the processing core 142 is configured to determine that pins of the electronic device that have the first-type test symbol are x pins, according to the first data; determine that pins of the memory device that have the first-type test symbol are y pins, according to the second data; and determine that the x pins of the electronic device are connected to the y pins of the memory device.

Alternatively, the test pattern includes a plurality of test symbols, and at least two of the test symbols are first-type test symbols, and at least two of the test symbols are second-type test symbols, wherein the test patterns, the first data, and the second data are plural.

Specifically, the processing core 142 is configured to obtain a plurality of sets of connection relationships according to the first data and the second data, and to determine the pin connection relationships between the pins of the memory device and the electronic device according to the sets of connection relationships, wherein each set of connection relationships indicates that there are connection relationships between a portion of the pins of the electronic device and a portion of the pins of the memory device.

Alternatively, the processing core 142 is further configured to input at least one test pattern to the memory device via the control port 143 to test the memory device, and obtain at least one third data from the pins 141, wherein the test symbols in each test pattern are the same; and when the test symbols in the third data match the test symbols in the corresponding test pattern, perform a test step on the memory device with at least one test pattern.

Specifically, the test patterns include a first test pattern and a second test pattern, wherein the test symbols in the first test pattern are different from those in the second test pattern. The processing core 142 is further configured to determine the pins under test of the electronic device according to the third data corresponding to the first test pattern and the other third data corresponding to the second test pattern.

Alternatively, the processing core is configured to repeatedly test the memory device with each test pattern to obtain a plurality of test results; and determine the test result that has the largest number of continues occurrences as the first data.

In the aforementioned embodiments, the first-type test symbol is "0" in binary and the second-type test symbol is "1" in binary. Alternatively, the first-type test symbol is "1" in binary and the second-type test symbol is "0" in binary.

In an embodiment, the memory device is a low-power double data-rate synchronous dynamic random access memory (LPDDR SDRAM), and the electronic device is a system-on-chip (SoC).

The processing core 142 may perform the aforementioned steps by executing storage commands, wherein the storage commands can be stored in the memory device connected to the electronic device. The processing core 142 reads the commands from the memory device via the pins on the electronic device. The storage commands can be stored in an internal memory of the electronic device or in another storage medium that is connected to the electronic device.

The methods in the aforementioned embodiments can be applied to the processing core 142, or performed by the processing core 142. The processing core 142 may be an integrated circuit (IC) capable of processing signals. In the implementation, each step in the aforementioned methods can be performed by the hardware integrated logic circuit of the processing core 142 or performed by software instructions. The processing core 142 may be a general-purpose processor, a digital signal processor (DSP), an application-specific integrated circuit (ASIC), a field-programmable gate array (FPGA) or another programmable logic device, discrete gate or transistor logic, or discrete hardware component capable of implementing or performing each method, step, or logic block disclosed in the embodiments of the invention. The general-purpose processor may be a microprocessor or any conventional processor or the like. The steps of the method disclosed in the embodiments of the present disclosure may be directly executed and completed by means of a hardware decoding processor, or may be executed and completed by using a combination of hardware and software modules in a decoding processor. The software module may be located in a mature storage medium in the art, such as a random access memory (RAM), a flash memory, a read-only memory (ROM), a programmable read-only memory, an electrically erasable programmable memory, or a register. The processing core 142 reads an instruction in the corresponding storage medium and completes the steps in the foregoing method in combination with hardware of the processing core 142.

In the aforementioned embodiments, the memory device is tested with test patterns to obtain the first data output from the electronic device that is connected to the memory device and obtain the second data that is output from the memory device with the test pattern. Since the pins of the electronic device and the memory device being connected have the same output, the pin connection relationships between the memory device and the electronic device can be rapidly and precisely determined by comparing the first data with the second data.

In the several embodiments provided in the present application, it should be understood that the disclosed system, apparatus, and method may be implemented in other manners. For example, the described embodiment is merely exemplary. For example, the unit division is merely logical function division and may be another division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The software product is stored in a storage medium and includes several instructions for instructing a computer device (which may be a personal computer, a server, or a network device) or a processor to perform all or some of the steps of the methods described in the embodiments of the present disclosure. The foregoing storage medium includes any medium that can store program code, such as a universal serial bus (USB) flash drive, a removable hard disk, a ROM, a RAM, a magnetic disk, or an optical disc.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wire order testing method for determining pin connection relationships between a memory device and an electronic device, the method comprising:
    testing the memory device with at least one test pattern to obtain at least one first data;
    predicting at least one second data that is to be correspondingly obtained from testing of the memory device with the at least one test pattern according to mapping relationships between the test pattern and pins of the memory device; and
    determining the pin connection relationships between the memory device and the electronic device according to the at least one first data and the at least one second data.

2. The wire order testing method as claimed in claim 1, wherein the testing step comprises: performing a command address (CA) training test on the memory device with the at least one test pattern.

3. The wire order testing method as claimed in claim 1, wherein the test pattern comprises a plurality of test symbols, and one of the plurality of test symbols is a first-type test symbol, and the other test symbols are second-type test symbols.

4. The wire order testing method as claimed in claim 3, wherein the determining step comprises:
    determining that the pins of the electronic device that have the first-type test symbol are x pins according to the at least one first data;
    determining that the pins of the memory device that have the first-type test symbol are y pins according to the at least one second data; and
    determining that the x pins of the electronic device is correspondingly connected to the y pins of the memory device, wherein x and y are positive integers.

5. The wire order testing method as claimed in claim 3, wherein when the first-type test symbol is "0" or "1" in binary, the second-type test symbol is correspondingly "1" or "0" in binary.

6. The wire order testing method as claimed in claim 1, wherein the test pattern comprises a plurality of test symbols, and at least two of the plurality of test symbols are first-type test symbols and at least two of the plurality of test symbols are second-type test symbols,
    wherein the at least one test pattern, the at least one first data, and the at least one second data are all plural.

7. The wire order testing method as claimed in claim 6, wherein the determining step comprises:
    obtaining a plurality of sets of mapping relationships according to the at least one first data and the at least one second data; and
    determining the pin connection relationships between the memory device and the electronic device according to the sets of mapping relationships,
    wherein each set of mapping relationships indicates that: there are connection relationships between a portion of the pins on the electronic device and a portion of the pins on the memory device.

8. The wire order testing method as claimed in claim 7, wherein the obtaining step comprises:
    determining a plurality of first pins having the first-type test symbol from the pins of the electronic device according to one of the at least one first data;
    determining a plurality of second pins having the first-type test symbol from the pins of the memory device according to one of the at least one second data; and
    determining a set of mapping relationships, wherein the set of mapping relationships indicates that the first pins and the second pins have connection relationships.

9. The wire order testing method as claimed in claim 1, wherein before the testing step, the method further comprises:
    testing the memory device with at least one test pattern to obtain at least one third data, wherein the test symbols in each of the at least one test pattern are the same; and
    performing the test step on the memory device with the at least one test pattern, when the test symbols in the third data match the test symbols in the corresponding test pattern.

10. The wire order testing method as claimed in claim 9, wherein the at least one test pattern comprises a first test pattern and a second test pattern, and the test symbols in the first test pattern and those in the second test pattern are different, and the method further comprises:
    determining pins under test of the electronic device according to the third data corresponding to the first test pattern and another third data corresponding to the second test pattern.

11. The wire order testing method as claimed in claim 1, wherein the testing step comprises:
    testing the memory device repeatedly with each of the at least one test pattern to obtain a plurality of test results; and
    determining one of the test results that have the largest number of continuous occurrences as the first data.

12. The wire order testing method as claimed in claim 1, wherein the memory device is a low-power double data rate synchronous dynamic random access memory, and the electronic device is a system-on-chip.

13. An electronic device, comprising:
a plurality of pins;
a processing core; and
a control port,
wherein the pins are connected to a plurality of pins of a memory device on a one-to-one basis, and the control port is configured to connect a controlled port of the memory device,
wherein the processing core is configured for:
inputting at least one test pattern to the memory device via the control port to test the memory device, and obtain at least one first data from the pins;
predicting at least one second data that is to be obtained from the testing of the memory device with at least one test pattern according to the mapping relationship between the test pattern and the pins of the memory device; and
determining the connection relationships between the pins of the memory device and the electronic device according to the at least one first data and the at least one second data.

14. The electronic device as claimed in claim 13, wherein the processing core is further configured to perform a command address training test on the memory device with the at least one test pattern.

15. The electronic device as claimed in claim 13, wherein the test pattern comprises a plurality of test symbols, and one of the test symbols is a first-type test symbol, and the other test symbols are second-type test symbols.

16. The electronic device as claimed in claim 15, wherein the processing core is further configured for:
determine pins having the first-type test symbol from the pins of the electronic device as x pins according to one of the first data;
determine pins having the first-type test symbol from the pins of the memory device as y pins according to one of the second data; and
determine the x pins of the electronic device are connected the y pins of the memory device.

17. The electronic device as claimed in claim 13, wherein the test pattern comprises a plurality of test symbols, and at least two of the test symbols are first-type test symbols, and at least two of the test symbols are second-type test symbols.

18. The electronic device as claimed in claim 17, wherein the processing core is further configured for:
obtain a plurality of sets of connection relationships according to the first data and the second data; and
determine the pin connection relationships between the pins of the memory device and the electronic device according to the sets of connection relationships,
wherein each set of the connection relationships indicates that there are connection relationships between a portion of the pins of the electronic device and a portion of the pins of the memory device.

19. A wire order testing apparatus for determining pin connection relationships between a memory device and an electronic device, the apparatus comprising:
a testing module, configured to test the memory device with at least one test pattern to obtain at least one first data;
a prediction module, configured to predict at least one second data that is to be obtained from the testing of the memory device with the at least one test pattern according to mapping relationship between the test pattern and pins of the memory device; and
a determination module, configured to determine pin connection relationships between the pins of the memory device and the pins of the electronic device according to the at least one first data and the at least one second data.

20. The wire order testing apparatus as claimed in claim 19, wherein the testing module is further configured to perform a command address training test on the memory device with the at least one test pattern.

\* \* \* \* \*